United States Patent [19]

Voorman

[11] 3,918,014

[45] Nov. 4, 1975

[54] GYRATOR RESONANT CIRCUIT HAVING REGULATION OF SUPPLY CURRENT

[75] Inventor: Johannes Otto Voorman, Eindhoven, Netherlands

[73] Assignee: U.S. Philips Corporation, New York, N.Y.

[22] Filed: July 17, 1974

[21] Appl. No.: 489,371

[30] Foreign Application Priority Data

July 23, 1973 Netherlands ....................... 7310197

[52] U.S. Cl. .................. 334/14; 307/229; 307/296; 323/4; 333/80 R; 333/80 T; 328/144

[51] Int. Cl.² ..................... H03H 5/12; H03H 11/00

[58] Field of Search ............. 333/80 R, 80 T; 323/1, 323/4; 334/11, 14

[56] References Cited

UNITED STATES PATENTS

| | | | |
|---|---|---|---|
| 3,475,690 | 10/1969 | Hurtig | 333/80 R X |
| 3,725,799 | 4/1973 | Cubbison, Jr. | 333/80 T X |

*Primary Examiner*—Paul L. Gensler
*Attorney, Agent, or Firm*—Frank R. Trifari; George B. Berka

[57] ABSTRACT

A gyrator resonant circuit comprising input and output gates having voltages shifted in phase by 90°, and a signal-dependent supply current source including two squaring devices and a summing device.

2 Claims, 3 Drawing Figures

GYRATOR RESONANT CIRCUIT HAVING REGULATION OF SUPPLY CURRENT

Figure 1:
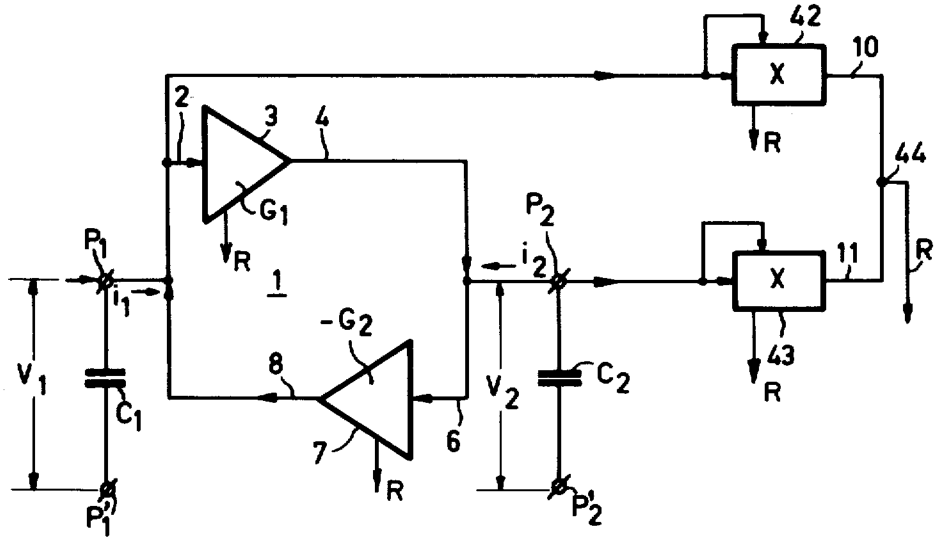

The invention relates to a device including a gyrator resonant circuit which is provided with a first gate and a second gate which each are terminated by a capacitance, which gyrator resonant circuit includes a first voltage-controlled current source of positive transconductance and a second voltage-controlled current source of negative transconductance, the input of the said first voltage-controlled current source being connected to the output of the said second voltage-controlled current source to form the said first gyrator gate, while the input of the second-voltage-controlled current source is connected to the output of the said first voltage-controlled current source to form the said second gyrator gate, the two voltage-controlled current sources being connected to supply current sources for adjusting the direct currents which flows through the two voltage-controlled current sources, whilst the supply current sources are provided with control inputs.

As is known, in devices of the abovedescribed type the gyrator transforms the capacitor connected to its output gate into a synthetic inductance which together with the capacitor connected to the gyrator input gate forms the resonant circuit. The gyrator has the known property that in principle the value of the synthetic inductance can simply be varied by varying the gyrator constant transconductance G, which means that by varying the settings of variable resistors or by a suitable choice of the quotient of emitter areas in the current mirrors used in the gyrator resonance circuit a change in tuning of the gyrator resonant circuit can simply be achieved.

In general, the value of the quality factor Q of the resonant circuit obtained by means of the gyrator is used as a measure of the usability of such a device. Advantageous utilization of bipolar monolithic constructions has enabled gyrator resonant circuits to be realized which are tunable in frequency over several octaves and moreover have a comparatively high Q factor.

A general tendency is to reduce signal distortion to a minimum. Hence electronic gyrators usually include amplifiers operated in class A. As a result, one must accept a low efficiency of, for example, 1.5 percent and hence one must put up with a high dissipation (heat production).

An improvement of the efficiency and hence a reduction of the dissipation are obtainable by causing the value of the supply current to follow the changes in value of the signal. This is obtainable, for example, by means of peak detection of the signal, from which the signal for regulating the supply current is derived. However, peak detection is slow and in the case of a sudden increase in signal value gives rise to considerable distortion.

Another possibility of mitigating the said disadvantage is full-wave rectification of the signal, the signal for regulating the supply current being derived from the rectified signal. This possibility has the advantage that regulation of the supply current is instantaneous (without inertia). In gyrator resonant circuits having high quality factors Q, however, this method has the disadvantage that the circuit can be excited by cross modulation of the supply current by the signal, because the supply current has a strong component at twice the frequency of the signal.

It is an object of the present invention to provide another solution of the problem of generating a signal for regulating the supply current, and the invention is characterized in that the device is provided with a first squaring unit for producing the square of the signal applied to the input of the said first voltage-controlled current source, a second squaring unit for producing the signal applied to the input of the second voltage-controlled current source, and a summing device which is connected to the outputs of the first and second squaring units and produces the sum of the squared signals, the output of the summing device being coupled to the control inputs of the supply current sources.

Using the steps according to the invention provides the important advantage that regulation of the supply current is instantaneous while intermodulation is reduce in proportion as the quality factor of the gyrator resonant circuit is increased. A reduction of the mean dissipation by a factor of 100 is readily obtainable. Only with a maximum signal at the relevant gyrator and, in addition, at the correct frequency the supply current will be a maximum. Furthermore, a decrease of the mean supply current will result in a decrease of the mean noise of the circuit. This provides the advantage that far smaller signals can be handled with freedom from noise.

Figure 2:
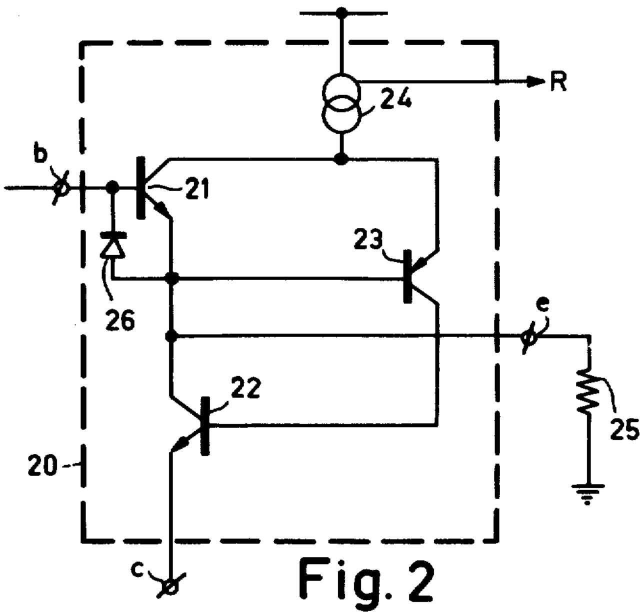
Figure 3:
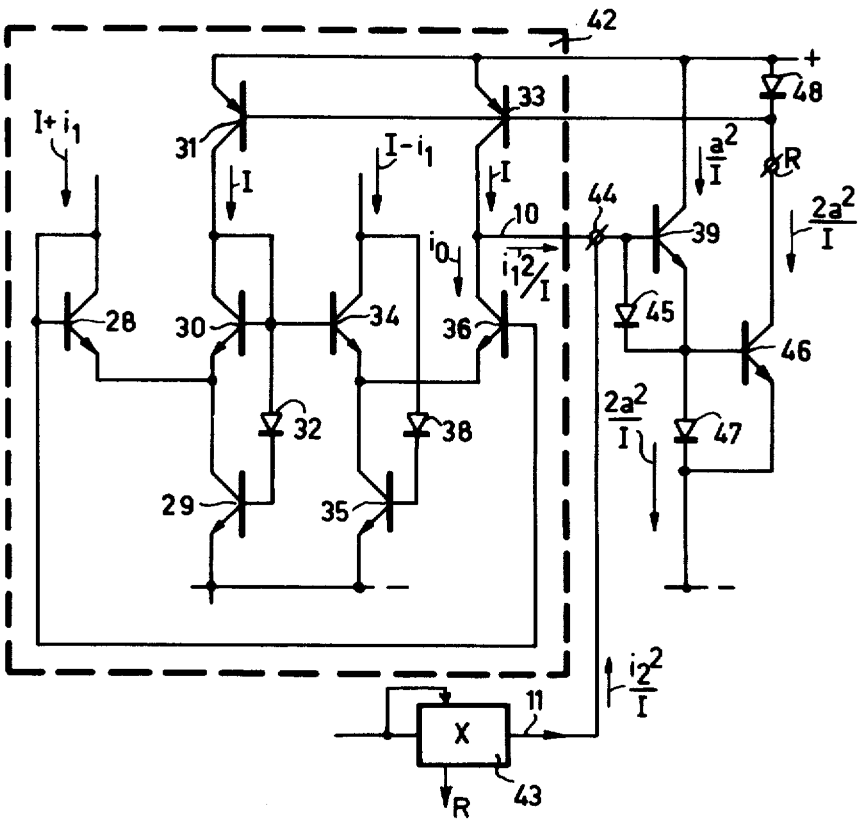

Embodiments of the invention will now be described, by way of example, with reference to the accompanying diagrammatic drawings, in which:

FIG. 1 is a circuit diagram showing schematically the basic elements of the device including a gyrator resonant circuit according to the invention, FIG. 2 shows a preferred embodiment of the voltage-controlled current sources used in the device of FIG. 1 and, FIG. 3 shows a preferred embodiment of a squaring unit used in the device shown in FIG. 1.

Referring now to FIG. 1, a gyrator 1 has a first gate $P_1$–$P_1'$ and a second gate $P_2$–$P_2'$. the first gate $P_1$–$P_1'$ is terminated by a capacitor $C_1$, and the second gate $P_2$–$P_2'$ is terminated by a capacitor $C_2$. A gyrator fundamentally comprises two inversely parallel connected amplifying stages 3 and 7 of positive transconductance $G_1$ and negative transconductance $G_2$ respectively. Each stage is a voltage controlled current source assumed to perform accurate conversion of a voltage into a current. Thus the gyrator transforms the capacitor $C_2$ connected to its second gate $P_2$–$P_2'$ into a synthetic inductance.

$$L_{EQ} = \frac{C_2}{G_1 G_2}$$

which together with the capacitor $C_1$ connected to the first gate $P_1$–$P_1'$ forms a resonant circuit.

The gyrator of FIG. 1 comprises a first voltage-controlled current source 3 of positive transconductance the output 4 of which is connected to the input 6 of a second voltage-controlled current source 7 of negative transconductance to form the second gyrator gate $P_2$–$P_2'$. The input 2 of the first voltage-controlled current source 3 is connected to the output 8 of the second voltage-controlled current source 7 to form the first gyrator gate $P_1$–$P_1'$. The input 2 of the first voltage-controlled current source 3 is connected to a first squaring unit 42 for producing the square of the signal applied to the input of the said first voltage-controlled current source 3. The input 6 of the second voltage-controlled current source 7 is connected to a second squaring unit 43 for producing the square of the signal applied to the input of the second voltage-controlled current source. The outputs 10 and 11 of the first and second squaring units respectively are connected to a summing device 44. The output R of the summing device 44 is connected to the control inputs of the respective supply current sources of circuits 3, 7, 42 and 43.

Voltage-controlled current sources, which may be used in the device shown in FIG. 1 are known and fundamentally comprise a transistor and a resistor, care being taken to ensure suitable direct-current biasing of the transistor.

However, in order to obtain the high input impedance and steep slope required for accurate voltage-to-current conversion what are generally referred to as equivalent transistors are generally used.

FIG. 2 shows a possible embodiment of such an equivalent transistor. The part 20 of the voltage-controlled current source which is surrounded by dotted lines constitutes the equivalent transistor having a base *b*, an emitter *e* and a collector *c*. The equivalent transistor comprises transistors 21, 22 and 23. The collector of the transistor 21 is connected to a constant-potential supply point via a high-impedance current source 24. The base and the emitter of the transistor 21 are interconnected via a diode 26. The emitter of the transistor 21 further is connected via a resistor 25 to a point of constant potential and via the collector-emitter path of the transistor 22 to the output c of the device. The base of the transistor 22 is connected to a collector of the transistor 21 via the collector-emitter path of the transistor 23. The base of the transistor 23 is connected to the emitter of the transistor 21. The voltage-controlled current source described has the advantage of providing highly accurate voltage-to-current conversion irrespective of the transistor parameters, as described in more detail in co-pending Netherlands Pat. application No. 7,102,199 (PHN. 5420, UK Pat. No. 1,317,869). Such equivalent transistors enable gyrators to be realized, as described for example in "I.E.E.E. Journal of Solid State Circuits," Volume SC-7, No. 6, December 1972, pages 469 to 474.

Squaring units or current multipliers of the type which may be used in the device shown in FIG. 1 are also known. FIG. 3 shows a possible embodiment of such a squaring unit. In this Figure, the first squaring unit 42 only is shown in detail. The second squaring unit 43 is of identical structure and is shown schematically in the Figure. The collector and the base of a transistor 28 are connected to the base of a transistor 36. The emitters of transistors 28 and 30 are connected to a supply point of, for example, negative potential via the collector-emitter path of a transistor 29. The collector of the transistor 30 is connected to a supply point of, for example, positive potential via the collector-emitter path of a transistor 31. The collector of the transistor 30 is also connected, via a diode 32, to the base of the transistor 29. The emitters of transistors 34 and 36 are connected to a supply point of negative potential via the collector-emitter path of a transistor 35. The collector of the transistor 34 is connected to the base of the transistor 35 via a diode 38. The base of the transistor 34 is connected to the base of the transistor 30. The collector of the transistor 36, which also forms the output 10 of the first squaring unit 42, is connected to a supply point of positive potential via the collector-emitter path of a transistor 33. The output 10 of the first squaring unit 42 and the output 11 of the second squaring unit 43 are connected to the point 44, which in the embodiment shown forms the summing device. The summing device 44 is connected to a point of negative potential via the series connection of diodes 45 and 47. The diode 45 is shunted by the base-emitter part of a transistor 39 the collector of which is connected to a point of positive potential. The diode 47 is shunted by the base-emitter path of a transistor 46 the collector of which is connected via a diode 48 to a point of positive potential. The collector of the transistor 46 is also connected to the bases of the transistors 31 and 33.

As is known, when the gyrator transconductance G of the first voltage-controlled current source 3 passes a current $i_1 = a.\sin\omega t$, in the vicinity of the resonant frequency the gyrator resistance G of the second voltage-controlled current source 7 will pass substantially a current $i_2 = a.\cos\omega t$, so that a 90° phase shift is obtained without the use of additional means. Squaring and adding the two signals $i_1$ and $i_2$ yields $$a^2.\ \sin^2\omega t + a^2.\ \cos^2\omega t = a^2 \qquad (1)$$

which sum signal $a^2$ is a measure of the amplitude of the output signal. This sum signal is used as a regulating signal for the supply current sources of the gyrator 1 and the two squaring units 42 and 43, as will now be set out more fully.

To the collector of the transistor 28 a current $(I + i_1)$ is supplied, where I is equal to the value of the supply currents supplied by the supply current sources of the device of FIG. 1, and $i_1$ is equal to the above-mentioned signal current $a.\ \sin\omega t$ at the input of the first voltage-controlled current source 3. A current $(I - i_1)$ is supplied to the collector of the transistor 34. The transistors 31 and 33 are two supply current sources for the squaring unit 42 and each supply a supply current I to the transistor 30 and the transistor 36 respectively. For the circuit shown in FIG. 3 we have approximately:

$$\frac{kT}{q}\left\{ln\ \frac{I+i_1}{I_s} - ln\ \frac{I}{I_s} + ln\ \frac{I-i_1}{I_s} - ln\ \frac{i_o}{I_s}\right\} = 0 \qquad (2)$$

where k = Boltzmann's constant
T = absolute temperature
q = charge on electron
$I_s$ = saturation current of the transistors used
$i_o$ = output current at the collector of the transistor 36.

From the equation (2) it follows that the output current which appears at the collector of the transistor 36 is equal to $$i_0 = \frac{(I+i_1)\ (I-i_1)}{I} = I - \frac{i_1^2}{I} \qquad (3)$$

From the above it follows that at the output 10 of the squaring unit 42 a current $i_1^2$ /I will flow to the summing device 44. In a manner identical to that described with respect to the squaring unit 42, by means of the squaring unit 43 a regulating current $i_2^2$ / I is produced which is also supplied to the summing device 44. For this purpose the currents $(I+i_2)$ and $I-i_2)$ are supplied to the collectors of the corresponding transistors 28 and 34 respectively. The diode 45 passes the summed regulating current $(i_1^2 + i_2^2)/I = a^2/I$. If the diode 45 and the base-emitter diode of the transistor 39 have equal electric properties, the collector-emitter path of the transistor 39 will pass a current equal to $a^2/I$. The diode 47 then will pass a current equal to $2a^2/I$, and if the electric properties of the diode 47 and of the base-emitter diode of the transistor 46 are equal, the collector-emitter path of the transistor 46 will pass a current of equal value. This current is the regulating current for the supply current sources of the device shown in FIG. 1. This is indicated in FIG. 3 for two supply current sources. The regulating current $2a^2/I$ is passed by a diode 48, so that across this diode a voltage is produced which is set up in parallel across the base-emitter path of the transistors 31 and 33 which constitute the supply current sources for the squaring unit 42. The current which flows through the emitter-collector path of the said transistors is equal to $$I = a.\sqrt{2} \quad (4)$$

Thus the value of the supply current I varies in direct proportion to the amplitude $a$ of the output signal and moreover always exceeds this amplitude. The factor by which the supply current I exceeds the amplitude of the output signal is set by means of the current mirror formed by the diode 45 and the transistor 39 and of the current mirror formed by the diode 47 and the transistor 46. The two current mirrors together form a current multiplier. In the embodiment described the said factor is equal to $\sqrt{2}$, because it has been assumed that the quotient of the emitter areas of the diode 45 and the base-emitter diode of the transistor 39 and the quotient of the emitter areas of the diode 47 and the base-emitter diode of the transistor 46 both are equal to 1. The said factor can be set at will by selecting the said quotients, however, it must always exceed 1.

FIG. 3 shows how the supply current sources 31 and 33 can be regulated by means of the regulating signal produced at the output R. In the embodiment described, the control inputs of the said supply current sources are constituted by the bases of the transistors

31 and 33 which act as the supply current sources. However, all the supply current sources required in the device shown in FIG. 1 may be regulated in an identical manner. Thus, for example, in the gyrator shown in FIG. 6 of the abovementioned paper in "I.E.E.E. Journal of Solid State Circuits" all the supply current sources used, which are formed by the transistors which each above a resistor in the emitter circuit, may be coupled to the output R (FIG. 3) in an identical manner.

What is claimed is:

1. A gyrator resonant circuit comprising: a first voltage controlled current source of positive transconductance and a second voltage-controlled current source of negative transconductance, the input of said first voltage-controlled current source being connected to the output of said second voltage-controlled current source to form a first gyrator gate and the input of said second voltage controlled current source being connected to the output of said first voltage controlled current source to form a second gyrator gate; a capacitance terminating each gate; a first squaring unit coupled to the first gate for producing the square of the signal applied to the input of said first voltage controlled current source, a second squaring unit coupled to the second gate for producing the square of the signal applied to the input of said second voltage controlled current source; a summing device connected to the outputs of said first and second squaring unit to produce the sum of the squared signals; and a plurality of signal dependent supply current sources for setting the direct currents flowing through the two voltage controlled current sources, each of said supply current sources having a control input connected to the output of said summing device.

2. A gyrator resonant circuit as claimed in claim 1, wherein the output of the summing device is connected to the control inputs of the supply current sources via a current multiplier.

* * * * *